(12) United States Patent
Hsieh et al.

(10) Patent No.: US 12,519,021 B2
(45) Date of Patent: Jan. 6, 2026

(54) SEMICONDUCTOR PACKAGE INCLUDING TEST LINE STRUCTURE

(71) Applicant: Taiwan Semiconductor Manufacturing Company, Ltd., Hsinchu (TW)

(72) Inventors: Tsung-Yang Hsieh, Taipei (TW); Chien-Chang Lee, Miaoli County (TW); Chia-Ping Lai, Hsinchu (TW); Wen-Chung Lu, Hsinchu (TW); Cheng-Kang Huang, Hsinchu (TW); Mei-Shih Kuo, Hsinchu (TW); Alice Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 107 days.

(21) Appl. No.: 17/469,055

(22) Filed: Sep. 8, 2021

(65) Prior Publication Data

US 2022/0344225 A1 Oct. 27, 2022

Related U.S. Application Data

(60) Provisional application No. 63/178,812, filed on Apr. 23, 2021.

(51) Int. Cl.
*H01L 23/498* (2006.01)
*H01L 21/66* (2006.01)
(Continued)

(52) U.S. Cl.
CPC ........ *H01L 22/32* (2013.01); *H01L 23/49811* (2013.01); *H01L 23/49822* (2013.01);
(Continued)

(58) Field of Classification Search
CPC .. H01L 22/32; H01L 23/585; H01L 23/49833
See application file for complete search history.

(56) References Cited

U.S. PATENT DOCUMENTS 5,886,409 A * 3/1999 Ishino ................. H01L 23/3107
257/784
5,986,460 A * 11/1999 Kawakami .......... H01L 23/3128
257/E23.069

(Continued)

FOREIGN PATENT DOCUMENTS

CN 111725152 A * 9/2020 ............. H01L 22/26
JP 2000-174349 A 6/2000
(Continued)

*Primary Examiner* — Michele Fan
(74) *Attorney, Agent, or Firm* — FOLEY & LARDNER LLP

(57) ABSTRACT

A package comprises an interposer, comprising an interposer substrate including at least one layer, and a plurality of RDLs formed through at least a portion of the interposer substrate. The package also includes a die device structure comprising at least one device die, and a first test line (TL) structure interposed between the interposer and the die device structure. The first TL structure includes at least one first test line electrically coupled to the at least one device die, at least a portion of the at least one first test line extending beyond a peripheral edge of the die device structure to provide an electrical interface with the at least one device die.

20 Claims, 16 Drawing Sheets

(51) Int. Cl.
*H01L 23/00* (2006.01)
*H01L 25/065* (2023.01)

(52) U.S. Cl.
CPC .............. *H01L 24/16* (2013.01); *H01L 24/81* (2013.01); *H01L 24/32* (2013.01); *H01L 24/73* (2013.01); *H01L 25/0655* (2013.01); *H01L 2224/16225* (2013.01); *H01L 2224/32225* (2013.01); *H01L 2224/73204* (2013.01)

(56) References Cited

U.S. PATENT DOCUMENTS

| | | | |
|---|---|---|---|
| 2003/0164551 A1* | 9/2003 | Lee | H01L 21/563 |
| | | | 257/E23.079 |
| 2011/0278739 A1* | 11/2011 | Lai | H01L 23/481 |
| | | | 257/E23.141 |
| 2012/0305916 A1* | 12/2012 | Liu | H01L 23/585 |
| | | | 257/E23.151 |
| 2013/0342231 A1 | 12/2013 | Alfano et al. | |
| 2014/0333339 A1 | 11/2014 | Orr et al. | |
| 2015/0294953 A1 | 10/2015 | Chen et al. | |
| 2017/0287734 A1 | 10/2017 | Oh et al. | |
| 2017/0372976 A1 | 12/2017 | Chen et al. | |
| 2018/0315672 A1* | 11/2018 | Cassier | H01L 22/32 |
| 2019/0006250 A1* | 1/2019 | Mori | G01R 31/2884 |
| 2019/0013252 A1* | 1/2019 | Abraham | G01R 31/31713 |
| 2019/0131277 A1 | 5/2019 | Yang et al. | |
| 2022/0068835 A1* | 3/2022 | Kim | H01L 23/552 |

FOREIGN PATENT DOCUMENTS

| | | | |
|---|---|---|---|
| JP | 2008205178 A | * | 9/2008 |
| JP | 2009043845 A | * | 2/2009 |

\* cited by examiner

SEMICONDUCTOR PACKAGE INCLUDING TEST LINE STRUCTURE

CROSS-REFERENCE TO RELATED APPLICATIONS

The present application claims priority to and benefit of U.S. Provisional Application No. 63/178,812, filed Apr. 23, 2021, the entire disclosure of which is incorporated herein by reference.

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer on substrate (CoWoS) is widely used to integrate several chips into a single semiconductor device by through silicon via (TSV). During the CoWoS operation, a number of chips or dies are assembled on a single semiconductor device. Furthermore, numerous manufacturing operations are implemented within such a small semiconductor device. Generally testing of dies, chips, or other electronic components included in such semiconductor packages is performed after the semiconductor packages are completely fabricated, for example, after integration with an external substrate. A failure diagnosis of the chips or other components of the package at this stage results in the entire package along with the external components being discarded which increases loss.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
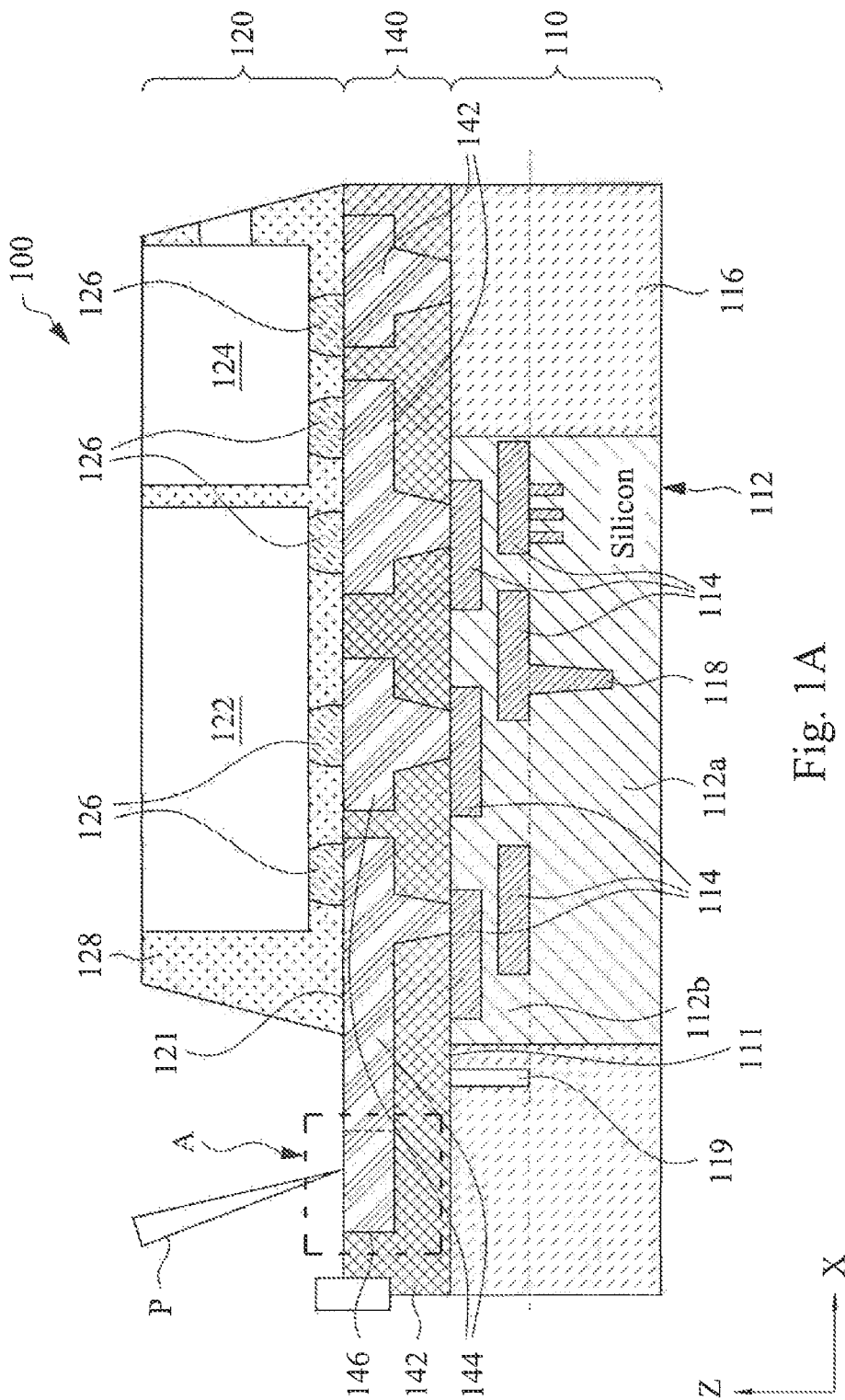
FIG. 1A is a side cross-section view of a package that includes a first test line (TL) structure interposed between an interposer and a die device structure, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Generally, testing of packages formed by CoWoS operations is performed after all the components of the package have been fabricated and integrated together. For example, to manufacture a package, a die device structure is bonded to an interposer to form a package. The interposer is bonded to an external substrate, and an underfill layer is inserted between the interposer and the external substrate. The final package is generally tested after bonding to the substrate because the underfill layer prevents access to individual dies. If any die included in the die device structure, or the interposer is determined to not be operating properly at this stage, the entire package including the external substrate has to be discarded, which significantly increases losses as the substrate as well as fabrication processes used to attach the substrate to the interposer may be expensive.

In contrast, the present disclosure relates to a package, that includes an interposer, comprising an interposer substrate including at least one layer, and a plurality of RDLs formed through at least a portion of the interposer substrate. A die device structure comprising at least one device die is disposed on a top surface of the interposer. Moreover, a first TL structure is interposed between a top surface of the interposer and a bottom surface of the die device structure. The first TL structure includes at least one first test line electrically coupled to the at least one device die, at least a portion of the at least one first test line extending beyond a peripheral edge of the die device structure so as to provide an electrical interface with the at least one device die. This allows testing of the one or more dies included in the die device structure, or to test the RDLs of the interposer without having to bond the package to an external substrate. In this manner, defects can be detected earlier saving costs if the package has to be discarded as a result of a malfunction detected in one or more device dies or the interposer during the testing. The present disclosure also relates to packages that include a second TL structure coupled to a bottom surface of the interposer. The second TL structure includes at least one first test line electrically coupled to the at least one via and extends proximate to a peripheral edge of the interposer so as to provide an electrical interface with the at least one via of the interposer. The second TL structure can be used to test the interposer so as to allow detection of failure of one or more vias of the interposer, and/or failure of the RDL structure of the interposer before coupling the package to the external substrate.

Figure 1B:
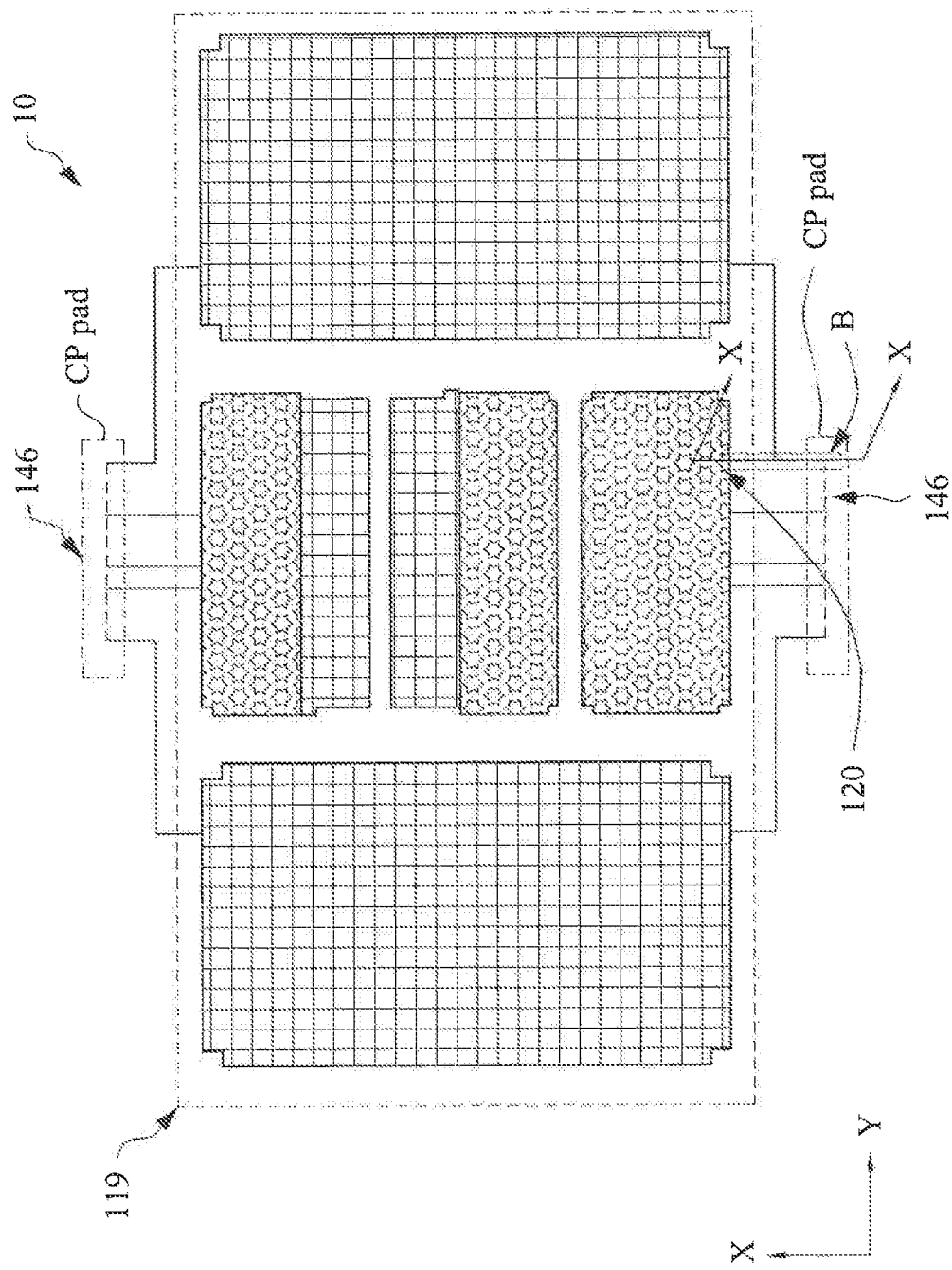
FIG. 1B is a top view of a die including a plurality of the packages shown in FIG. 1A. The cross-section shown in FIG. 1A is taken along the line X-X shown in FIG. 1B and represents a portion of the die 10 indicated by the arrow B.

FIG. 1A is a side cross-section view of a package 100 of a die, and FIG. 1B is a top view of the die including a plurality of the packages 100, according to an embodiment. The cross-section shown in FIG. 1A is taken along the line X-X shown in FIG. 1B and represents a portion of the die 10 indicated by the arrow B. The package 100 includes an interposer 110 including an interposer substrate 112 including at least one layer 112a/112b, and a plurality of RDLs 114 formed through at least a portion of the interposer substrate 112. The package 100 also includes a die device structure 120 including at least one device die 122, 124. A first TL structure 140 is interposed between a top surface 111 of the interposer 110 and a bottom surface 121 of the die device structure 120. In some embodiments, the package 100 is a semiconductor package. In some embodiments, the package 100 is an integrated fan out (InFO) package, where I/O terminals of the device dies 122, 124 are fanned out and redistributed over a surface of the device dies 122, 124 in a greater area. In some embodiments, the package 100 is a CoWoS package structure. In some embodiments, the package 100 is a system on integrated chips (SoIC) packaging structure. In some embodiments, the package 100 is a three dimensional integrated circuit (3D IC).

Expanding further, in some embodiments, the interposer substrate 112 of the interposer 110 comprises a first portion 112a located distal from the first TL structure 140, and a second portion 112b on which the first TL structure 140 is disposed. In some embodiments, the first portion 112a may include one or more layers of a semiconductor material such as silicon, germanium, gallium, arsenic, Si—Ge, any other suitable semiconductor material or combination thereof. In particular embodiments, the first portion 112a is a silicon substrate or silicon interposer. In some embodiments, the first portion 112a includes a dielectric material, for example, ceramic glass polymers, any other suitable material or a combination thereof. In some embodiments, the first portion 112a may be interposed between the second portion 112b and an external substrate (e.g., a printed circuit board). In some embodiments, the first portion 112a and the second portion 112b have a quadrilateral, rectangular, square, polygonal, or any other suitable shape.

In some embodiments, at least one via 118 is defined within at least the first portion 112a of the interposer substrate 112. In some embodiments, the at least one via 118 extends through the first portion 112a to a bottom surface of the interposer 110 opposite the top surface 111 of the interposer 110. In some embodiments, the via 118 includes a conductive material such as copper, silver, gold, aluminum, any other suitable conductive material or combination thereof. In some embodiments, the via 118 is a through substrate via or a through silicon via (TSV). While not shown, in some embodiments, the interposer substrate 112, or at least the first portion 112a of the interposer substrate 112 may include a plurality of vias 118. In some embodiments, a distance between two adjacent vias may be in a range of about 40 microns to 70 microns, inclusive. In some embodiments, the via 118 may have a width in a range of 8 microns to 15 microns, inclusive. Other ranges and values of the distance between vias 118 and width of the vias 118 are contemplated and are within the scope of this disclosure.

The plurality of RDLs 114 are formed through at least a portion of the interposer substrate 112, for example, the second portion 112b of the interposer substrate 112. In some embodiments, the interposer 110 may include the first portion 112a including the vias 118, and the second portion 112b may include a RDL structure that is separately formed and then bonded to the first portion 112a. In some embodiments, the second portion 112b includes a dielectric substrate including a plurality of dielectric layer stacked on top of each other to form an integrated structure. In some embodiments, the dielectric layers are formed of organic materials such as polymers, such as, for example, polybenzoxazole (PBO), benzocyclobutene (BCB), polyimide, or the like. In other embodiments, the dielectric layer may be formed of an inorganic material, such as, for example, silicon oxide, silicon nitride, silicon oxynitride, or the like. In some embodiments, the second portion 112b may also be formed from a semiconductor material, for example, silicon, germanium, gallium, arsenic, Si—Ge, any other suitable semiconductor material or combination thereof. The plurality of RDLs 114 are formed through the plurality of dielectric layers, or the semiconductor material forming the second portion 112b. The RDLs 114 may be formed of conducting materials, for example, metallic materials such as copper, aluminum, nickel, titanium, alloys thereof, or multilayers thereof.

In some embodiments, the interposer 110 further comprises an interposer encapsulating layer 116 that encapsulates at least a portion of the interposer substrate 112. In some embodiments, the interposer encapsulating layer 116 may include an underfill material, epoxy resin, any other suitable material or combination thereof. In some embodiments, the interposer encapsulating layer 116 has a high thermal conductivity, a low moisture absorption, and a high flexural strength. In some embodiments, a seal member 119 is formed in the interposer encapsulating layer 116 around the second portion 112b of the interposer substrate 112, and for example, may define an outer boundary of the die 10 within which the plurality of packages 100 are contained, as shown in FIG. 1B. In some embodiments, the seal member 119 may be formed from a conductive material, for example, the same material from which the RDLs 114 are formed, and may be formed simultaneously with forming of the RDLs 114. The seal member 119 extends to the top surface 111 of the interposer 110 and forms a seal with the first TL structure 140 disposed on the top surface 111 of the interposer 110, so as to prevent moisture from getting between the first TL structure 140 and the interposer 110.

The die device structure 120 includes at least one device die, for example, a first device die 122 and a second device die 124. In other embodiments, the die device structure 120 may only include a single device die, or more than two device dies. The first device die 122 and/or the second device die 124 may include a semiconductor substrate and integrated circuit devices (e.g., active devices such as transistors, memories, resistors, capacitors, etc.), for example, at a front surface of the semiconductor substrate (e.g., facing down i.e., towards the interposer 110). In some embodiments, the device dies 122, 124 may include a logic die such as a Central Processing Unit (CPU) die, a Graphic Processing Unit (GPU) die, a mobile application die, an application processing (AP) die, a memory die, a high bandwidth memory (HBM) die, or the like. In some embodiments, the device dies 122, 124 include a chip or a package. In some embodiments, the device dies 122, 124 have a top cross-section in a quadrilateral, a rectangular, or a square shape.

In some embodiments, the first device die 122 may include an active device die, i.e., the first device die 122 may include active circuits that take part in the overall operation of the package 100. In some embodiments, the second device die 124 may include a dummy device die that does not take part in operation of the package 100, but may increase mechanical strength of the package 100, for example, to reduce warpage. In various embodiments, the die device structure 120 may include a plurality of first device die 122 and/or the second device die 124. The device dies 122, 124 are molded in molding layer 128, which surrounds at least a portion of the device dies 122, 124, for example, sidewalls and a bottom surface of the device dies 122, 124. Molding layer 128 may be formed from a molding material such as a molding compound, a molding underfill, a resin, an epoxy, or the like. In some embodiments, the molding layer 128 has a high thermal conductivity, a low moisture absorption rate, and a high flexural strength. The material of the molding layer 128 may be the same as or different from the material of the interposer encapsulating layer 116. In some embodiments, the molding layer 128 may be formed by applying a non-solid material to encircle the device dies therein, and then curing the molding material, for example, through an Ultra-Violet (UV) curing or a thermal curing process, so that the applied non-solid material is solidified. A bottom surface of the device dies 122, 124 may include metal pillars/pads (e.g., copper pillars) that may be in contact with, and bonded to RDLs 114. A top surface of the molding layer 128 may be level with or higher than a top surface of the device dies 122, 124, which is distal from the first TL structure 140. In some embodiments, the RDLs 114 are configured to re-route a path of circuitry from the device dies 122, 124 and redistribute I/O terminals of the device dies 122, 124.

Electrical connectors, which are formed of a non-solder metallic material(s), may be formed at the bottom surface of the first device die 122 and the second device die 124. In some embodiments, the electrical connectors may include Under-Bump Metallurgies (UBMs) or metal pads. In some embodiments, the electrical connectors may include metal pads formed from any suitable metallic material, for example, copper, aluminum, titanium, nickel, palladium, gold, multi-layers, or alloys thereof. In some embodiments, bottom surfaces of the electrical connectors may be level with a bottom surface of the die device structure 120. In some embodiments, the bottom surfaces of the electrical connectors may extend below the bottom surface of the die device structure 120.

In some embodiments, the device dies 122, 124 include a top surface distal from the first TL structure 140, a bottom surface opposite to the top surface and facing the first TL structure 140, and a sidewall between the top surface and the bottom surface. In some embodiments, the sidewall is substantially orthogonal to the top surface or the bottom surface. In some embodiments, the bottom surface is an active side that several electrical components are disposed thereon. In some embodiments, the top surface is an inactive side that electrical component disposed thereon is absent.

In some embodiments, conductive bumps 126 are disposed between the device dies 122, 124 and the first TL structure 140, and electrically couple the device dies 122, 124 to corresponding first test lines 144 included in the TL structure 140. In some embodiments, the conductive bumps 126 are disposed between the bottom side of the device dies 122, 124 and a top surface of the TL structure 140. In some embodiments, the device dies 122, 124 are bonded with the first TL structure 140 by the conductive bumps 126. In some embodiments, the conductive bumps 126 are electrically connected to the RDLs 114 through the first TL lines 144.

In some embodiments, the conductive bumps 126 have a cylindrical, spherical, or hemispherical shape. In some embodiments, the conductive bumps 126 are a solder joint, a solder bump, a solder ball, a ball grid array (BGA) ball, a controlled collapse chip connection (C4) bump, a microbump or the like. In some embodiments, the conductive bumps 126 are a conductive pillar or post. In some embodiments, the conductive bumps 126 include metals such as lead, tin, copper, gold, nickel, etc. In some embodiments, a distance between two adjacent conductive bumps 126 is about 150 µm to about 200 inclusive. In some embodiments, the distance between two adjacent conductive bumps 126 is about 180 Other distances are also contemplated and are intended to be within the scope of this disclosure. In some embodiments, a ball placement step may be performed to drop solder balls in the openings formed in the molding layer 128 followed by a reflow process to reflow the solder balls so as to form the conductive bumps 126. In other embodiments, a solder layer may be plated in openings formed in the molding layer 128 followed by reflowing the solder layer in each opening to form the conductive bumps 126.

The first TL structure 140 is interposed between the top surface 111 of the interposer 110 and the bottom surface 121 of the die device structure 120. The first TL structure 140 comprises at least one first test line 144 electrically coupled to the device dies 122, 124 via corresponding conductive bumps 126. At least a portion of the at least one first test line 144 extends beyond a peripheral edge of the die device structure 120, for example, beyond an outer peripheral edge of the molding layer 128. The test line 144 provides an electrical interface with the first and second device dies 122, 124 and/or the interposer 110. The portion of the at least one first test line 144 that extends beyond the peripheral edge of the die device structure 120 can be used for probing the device dies 122, 124 and/or the interposer 110 before the package 100 is bonded to an external substrate. Thus, any faults in the device dies 122, 124 and/or the interposer 110 can be detected earlier preventing further losses which would occur if such a fault was detected after the package 100 has been bonded to an external substrate.

The first TL structure 140 includes a first TL dielectric layer 142 that at least partially encapsulates the at least one first test line 144. For example, cavities may be defined in the first TL dielectric layer 142 and the first test line material disposed therein so as form the first test lines 144. In some embodiments, the first TL dielectric layer 142 includes a dielectric material, for example, silicon dioxide, silicon nitride, polyimide (PI), polybenzoxazole (PBO), any other suitable dielectric material or combination thereof. Openings are formed through the first TL dielectric layer 142 through which the at least one first test line 144 extends and is electrically coupled to corresponding RDLs 114 of the interposer 110. Thus, the first TL dielectric layer 142 is disposed between the top surface 111 of the interposer 110 and the bottom surface 121 of the die device structure 120, and the at least one first test line 144 is embedded within the first TL dielectric layer 142. Portions of the at least one first test line 144 extends through the first TL dielectric layer 142 and are electrically coupled to corresponding RDLs 114 and the conductive bumps 126. A portion of the molding layer 128 is disposed on a top surface of the at least one first test line 144, and the conductive bumps 126 extend through the molding layer 128 and are coupled to top surfaces of corresponding first test lines 144. The first test line 144 is formed from a conductive material, for example, copper, gold, silver, titanium, chromium, platinum, any other suitable conductive material, or a combination thereof.

Figure 1C:
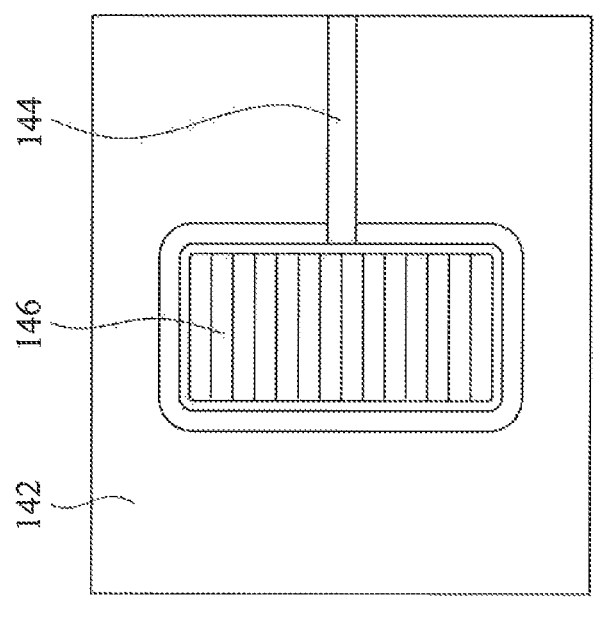
FIG. 1C is a top view of a portion of the package of FIG. 1A indicated by the arrow A in FIG. 1A.
Figure 1C:
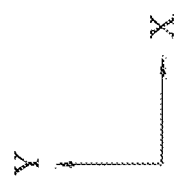

FIG. 1C is a top view of a portion of the package of FIG. 1A indicated by the arrow A in FIG. 1A. As shown in FIGS. 1B and 1C, the first TL structure 140 includes a plurality of first test pads 146 located at an axial end of the at least one first test line 144, for example, the axial ends of the first test line 144 that extend beyond the peripheral edge of the die device structure 120. A probe P is used to contact the first test pad 146 to probe, i.e., electrically test the device dies 122, 124 and/or the interposer 110. Thus, the first test lines 144 provide electrical communication between the interposer 110 and the die device structure 120, but simultaneously permit probing of the device dies 122, 124 and/or the interposer 110 before coupling with an external substrate. In some embodiments, once the testing is complete and the package 100 has cleared the testing, a portion of the package axially outward of the seal member 119, for example, the portion including the first test pad 146, may be separated from the package 100 (e.g., sawed off via a wafer die saw, or via laser cutting), to reduce die 10 area. In other embodiments, the exposed portion of the first test lines 144 may be covered with a dielectric material to electrically isolate the exposed portions of the first test lines 144 after testing is performed.

Figure 2:
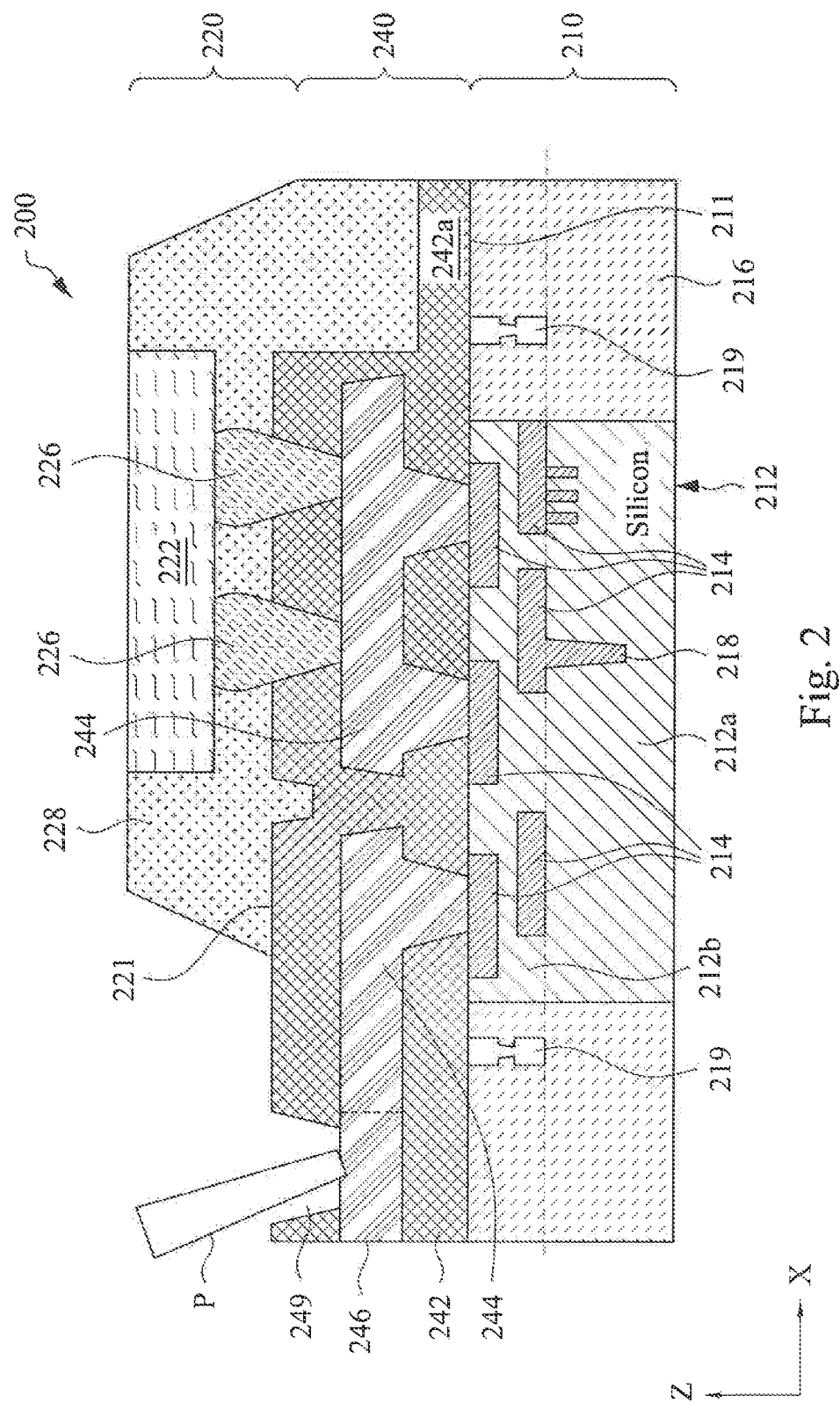
FIG. 2 is a side cross-section view of a package that includes a first TL structure interposed between an interposer and a die device structure, according to another embodiment.

FIG. 2 is a side cross-section view of a package 200, according to an embodiment. The package 200 includes an interposer 210 including an interposer substrate 212 including at least one layer 212a/212b, and a plurality of RDLs 214 formed through at least a portion of the interposer substrate 212. The package 200 also includes a die device structure 220 including at least one device die 222. A first TL structure 240 is interposed between a top surface 211 of the interposer 210 and a bottom surface 221 of the die device structure 220. In some embodiments, the package 200 is a semiconductor package. In some embodiments, the package 200 is an InFO package, where I/O terminals of the device die 222 are fanned out and redistributed over a surface of the device die 222 in a greater area. In some embodiments, the package 200 is a CoWoS packaging structure. In some embodiments, the package 200 is a SoIC packaging structure. In some embodiments, the package 200 is a 3D IC.

In some embodiments, the interposer substrate 212 of the interposer 210 comprises a first portion 212a located distal from the first TL structure 240, and a second portion 212b on which the first TL structure 240 is disposed. In some embodiments, the first portion 212a may include one or more layers of a semiconductor material such as, for example, silicon, germanium, gallium, arsenic, Si—Ge, any other suitable semiconductor material or combination thereof. In particular embodiments, the first portion 212a is a silicon substrate or silicon interposer. In some embodiments, the first portion 212a includes a dielectric material, for example, ceramic glass polymers, any other suitable material or a combination thereof. In some embodiments, the first portion 212a may be interposed between the second portion 212b and an external substrate (e.g., a printed circuit board). In some embodiments, the first portion 212a and the second portion 212b have a quadrilateral, rectangular, square, polygonal, or any other suitable shape.

In some embodiments, at least one via 218 is defined within at least the first portion 212a of the interposer substrate 212. The plurality of RDLs 214 are formed through at least a portion of the interposer substrate 212, for example, the second portion 212b of the interposer substrate 212. The interposer substrate 212 may be substantially similar to the interposer substrate 112 and therefore, not described in further detail herein.

In some embodiments, the interposer 210 further comprises an interposer encapsulating layer 216 that encapsulates at least a portion of the interposer substrate 212. In some embodiments, the interposer encapsulating layer 216 may include an underfill material, epoxy resin, any other suitable material or combination thereof. In some embodiments, the interposer encapsulating layer 216 has a high thermal conductivity, a low moisture absorption, and a high flexural strength. In some embodiments, a seal member 219 is formed in the interposer encapsulating layer 216 around the second portion 212b of the interposer substrate 212, and, for example, may define an outer boundary of a die within which a plurality of packages 200 are contained. In some embodiments, the seal member 219 may be formed from a conductive material, for example, the same material from which the RDLs 214 are formed, and may be formed simultaneously with forming of the RDLs 214. The seal member 219 extends to the top surface 211 of the interposer 210 and forms a seal with the first TL structure 240 disposed on the top surface 211 of the interposer 210, so as to prevent moisture from getting between the TL structure 240 and the interposer 210. In some embodiments, the seal member 219 may be a ring shaped structure having a circular, elliptical, rectangular, square, polygonal, or any other suitable shape.

The die device structure 220 includes a device die 222. In other embodiments, the die device structure 220 may include a plurality of device dies 222. The device die 222 may include a semiconductor substrate and integrated circuit devices (e.g., active devices such as transistors, memories, resistors, capacitors, etc.), for example, at a front surface of the semiconductor substrate (e.g., facing down i.e., towards the interposer 210). In some embodiments, the device die 222 may include a logic die such as a CPU die, a GPU die, a mobile application die, an AP die, a memory die, a HBM die, or the like. In some embodiments, the device die 222 is a chip or a package. In some embodiments, the device die 222 has a top cross-section in a quadrilateral, a rectangular, or a square shape.

In some embodiments, the device die 222 may include active circuits that take part in the overall operation of the package 200. While shown as including a single device die 222, in various embodiments, the die device structure 220 may include a plurality of device dies 222. The device die 222 is molded in a molding layer 228, which surrounds at least a portion of the device die 222, for example, sidewalls and a bottom surface of the device die 222. Molding layer 228 may be formed from a molding material such as a molding compound, a molding underfill, a resin, an epoxy, or the like. In some embodiments, the molding layer 228 has a high thermal conductivity, a low moisture absorption rate, and a high flexural strength. The material of the molding layer 228 may be the same as or different from the material of the interposer encapsulating layer 216. In some embodiments, the molding layer 228 may be formed by applying a non-solid material to encircle the device die 222 therein, and then curing the molding material, for example, through an UV curing or a thermal curing process, so that the applied non-solid material is solidified. The bottom surface of the device die 222 may include metal pillars/pads (e.g., copper pillars) that may be in contact with, and bonded to RDLs 214. A top surface of the molding layer 228 may be level with or higher than a top surface of the device die 222, which is distal from the first TL structure 240. In some embodiments, the RDLs 214 are configured to re-route a path of circuitry from the device die 222 and redistribute I/O terminals of the device die 222.

Electrical connectors, which are formed of a non-solder metallic material(s), may be formed at the bottom surface of the device dies 222. In some embodiments, the electrical connectors may include UBMs or metal pads. In some embodiments, the electrical connectors may include metal pads formed from any suitable metallic material, for example, copper, aluminum, titanium, nickel, palladium, gold, multi-layers, or alloys thereof. In some embodiments, the device dies 222 include a top surface distal from the first TL structure 240, and a bottom surface opposite to the top surface and facing the first TL structure 240, and a sidewall between the top surface and the bottom surface. In some embodiments, the sidewall is substantially orthogonal to the top surface or the bottom surface. In some embodiments, the bottom surface is an active side that several electrical components are disposed thereon. In some embodiments, the top surface is an inactive side that electrical component disposed thereon is absent.

In some embodiments, conductive bumps 226 are disposed between the device die 222 and the first TL structure 240, and electrically couple the device die 222 to corresponding first test lines 244 included in the first TL structure 240. In some embodiments, the conductive bumps 226 are disposed between the bottom side of the device die 222 and a top surface of the first TL structure 240. In some embodiments, the device die 222 is bonded with the first TL structure 240 by the conductive bumps 226. In some embodiments, the conductive bumps 226 are electrically connected to the RDLs 214 and the vias 218 through the first test line 244. Different from the package 100, the conductive bumps 226 may extend through the molding layer 228 as well as through a first TL dielectric layer 242 of the first TL structure 240.

In some embodiments, the conductive bumps 226 have a cylindrical, spherical, or hemispherical shape. In some embodiments, the conductive bumps 226 are a solder joint, a solder bump, a solder ball, a BGA ball, a C4 bump, a microbump or the like. In some embodiments, the conductive bumps 226 are a conductive pillar or post. In some embodiments, the conductive bumps 226 include metals such as lead, tin, copper, gold, nickel, etc. In some embodiments, a distance between two adjacent conductive bumps 226 is about 150 μm to about 200 μm, inclusive. In some embodiments, the distance between two adjacent conductive bumps 226 is about 180 μm. Other distances are also contemplated and are intended to be within the scope of this disclosure.

The first TL structure 240 is interposed between the top surface 211 of the interposer 210 and the bottom surface 221 of the die device structure 220. The first TL structure 240 comprises at least one first test line 244 electrically coupled to the device dies 222 via corresponding conductive bumps 226. At least a portion of the at least one first test line 244 extends beyond a peripheral edge of the die device structure 220, for example, beyond an outer peripheral edge of the molding layer 228. The test line 244 provides an electrical interface with the device die 222 and/or the interposer 210. The portion of the at least one first test line 244 that extends beyond the peripheral edge of the die device structure 220 can be used for probing the device die 222 and/or the interposer 210 before the package 200 is bonded to an external substrate. Thus, any faults in the device die 222 and/or the interposer 210 can be detected earlier preventing further losses, which would occur if such a fault was detected after the package 200 has been bonded to an external substrate.

The first TL dielectric layer 242 at least partially encapsulates the at least one first test line 244. In some embodiments, the first TL dielectric layer 242 include a dielectric material, for example, silicon dioxide, silicon nitride, PI, PBO, BCB, any other suitable dielectric material or combination thereof. A portion 242a of the first TL dielectric layer 242 located axially inward of a peripheral edge of die device structure 220 may have a small height than a remaining portion of the first TL dielectric layer 242, and a portion of the molding layer 228 may be disposed on the portion 242a. In such embodiments, a portion of the first TL structure 240 such as a portion of the first TL dielectric layer 242 is encapsulated by the molding layer 228.

A portion of the at least one first test line 244 extends through and is electrically coupled to corresponding RDLs 214 of the interposer 210, while the conductive bumps 226 extend through a second portion of the first TL dielectric layer 242 to the corresponding test line 244. Thus, the first TL dielectric layer 242 is disposed between the top surface 211 of the interposer 210 and the bottom surface 221 of the die device structure 220, and the at least one first test line 244 is embedded within the first TL dielectric layer 242 with portions of the at least one first test line 244 extending through the first TL dielectric layer 242 and being electrically coupled to the RDLs 214. The first test line 244 is formed from a conductive material, for example, copper, gold, silver, titanium, chromium, platinum, any other suitable conductive material, or a combination thereof.

The first TL structure 240 includes at least one first test pads 246 located at an axial end of the at least one first test line 244, for example, an axial end of the first test line 244 that extend beyond the peripheral edge of the device die 222. A first test window 249 is defined in the first TL dielectric layer 242 so as expose a top surface of the first test pad 246 so as to allow a probe P to contact the first test pad 246 so as to allow electrical probing of the device die 222 and/or the interposer 210 via the at least one first test line 244. Thus, the at least one first test line 244 provide electrical communication between the interposer 210 and the die device structure 220, but simultaneously permit probing of the device die 222 and/or the interposer 210 before coupling with an external substrate. In some embodiments, once the testing is complete and the package 200 has cleared the testing, a portion of the package axially outward of the seal member 219, for example, the portion including the first test pad 246, may be separated from the package 200 (e.g., sawed off via a wafer die saw, or via laser cutting), to reduce die 10 area. In other embodiments, the exposed portion of the at least one first test line 244 may be covered with a dielectric material to electrically isolate the exposed portions of the at least one first test line 244 after testing is performed.

Figure 3:
FIG. 3 is a schematic flow chart of a method of forming a package that includes a first TL structure interposed between an interposer and a die device structure, according to an embodiment.

FIG. 3 is a flowchart of a method 300 for forming a package including a first TL structure, according to an embodiment. The method 300 may be used to form the package 100, 200 or any other package described herein that includes a first TL structure (e.g., the first TL structure 140, 240). For example, at least some of the operations (or steps) of the method 300 may be used to form a semiconductor package (e.g., the package 100, 200). It should be noted that the method 300 is merely an example, and is not intended to limit the present disclosure. Accordingly, it is understood that additional operations may be provided before, during, and after the method 300 of FIG. 3, and that some other operations may only be described briefly described herein. In some embodiments, operations of the method 300 may be associated with side cross-section views of the example semiconductor package 200 at various fabrication stages as shown in FIGS. 4, 5, 6, 7, 8, and 9. Although FIGS. 4-9 illustrate the package 200 including the interposer 210, the first TL structure 240, and the die device structure 220, it is understood the semiconductor package 200 may include a number of other devices such as inductors, fuses, capacitors, coils, etc., which are not shown in FIGS. 4-9, for purposes of clarity of illustration.

The method 300 may generally include providing an interposer comprising an interposer substrate including at least one layer, and a plurality of RDLs formed through at least a portion of the interposer substrate. The method 300 includes forming a first TL structure on a top surface of the interposer, the first TL structure comprising at least one first test line. Conductive bumps are disposed on portions of the at least first test line. A device die of a die device structure is coupled to the conductive bumps. At least a portion of the at least one first test line extends beyond a peripheral edge of the die device structure so as to provide an electrical interface with the at least one device die.

Figure 4:
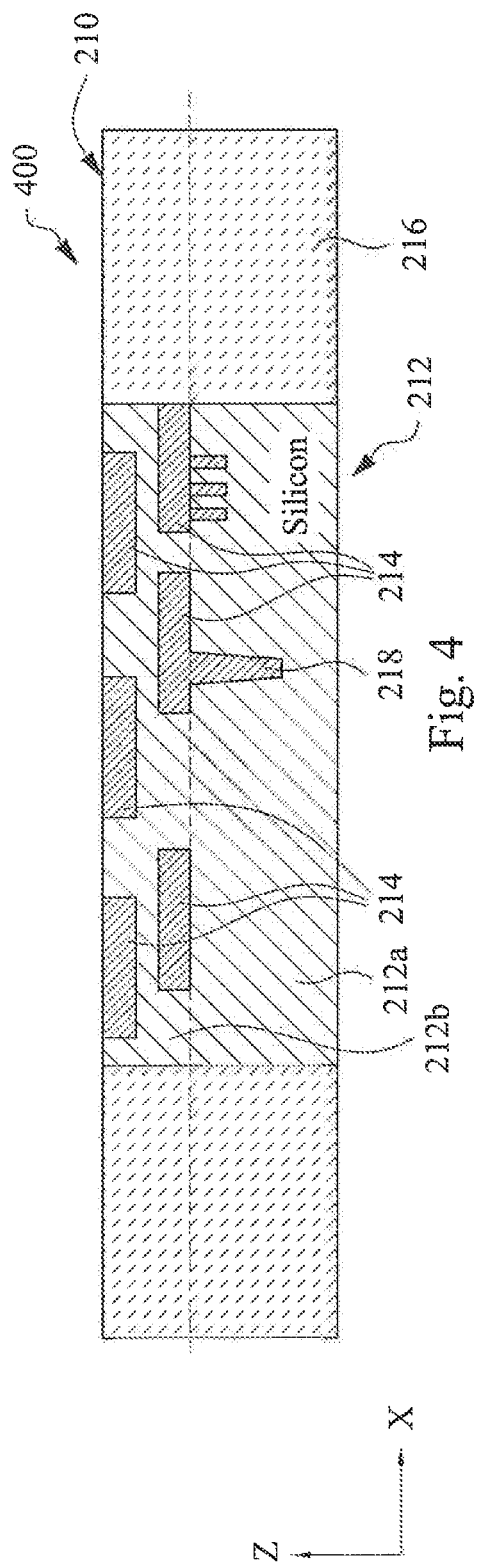
FIGS. 4-9 are side cross-section views of a package formed via the operations of the method 300, at various stages of fabrication of the package.

Expanding further, the method 300 includes providing an interposer, at operation 302. Corresponding to operation 302, FIG. 4 is a side cross-section of the interposer 210. The interposer 210 includes an interposer substrate 212. A plurality of RDLs 214 are formed in a second portion 212b of the interposer substrate 212, and at least one via 218 formed in a first portion 212a of the interposer substrate 212. The interposer 210 also includes the interposer encapsulating layer 216 that encapsulates at least a portion of the interposer substrate 212, for example, is disposed around axial sidewalls of the interposer substrate 212.

Figure 5:
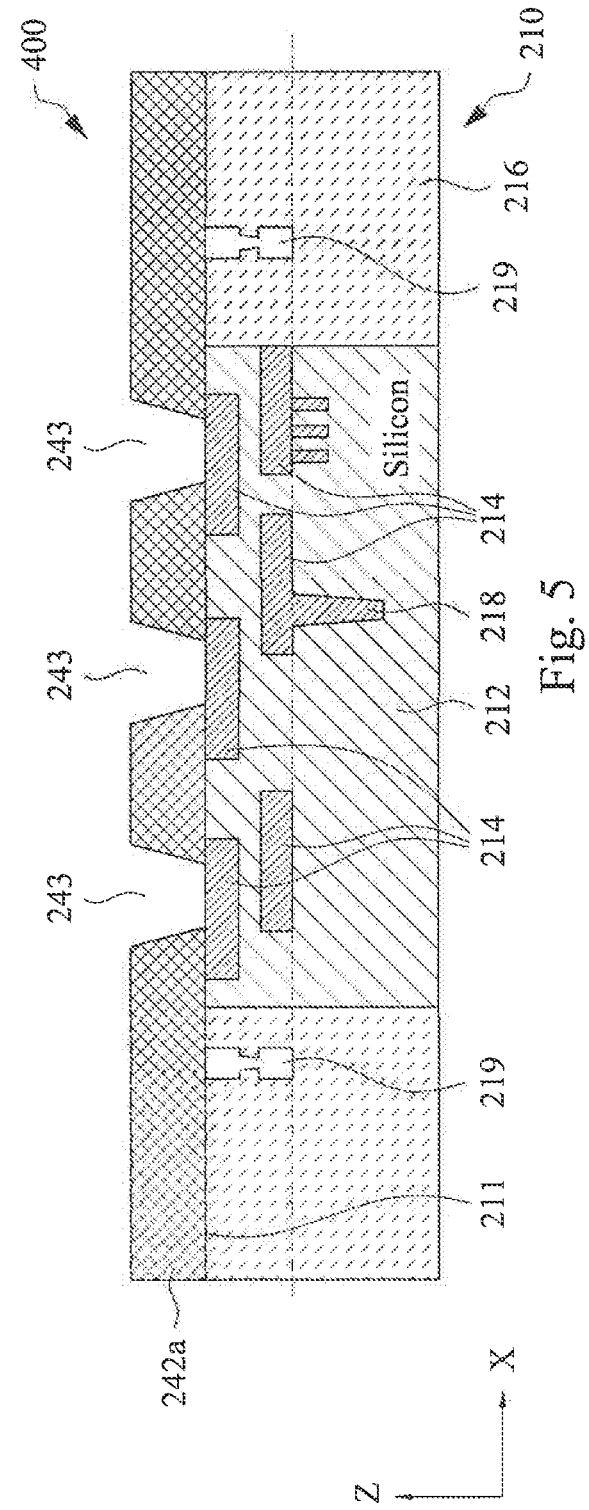

At operation 304, a seal member is formed in the interposer encapsulating layer. At operation 306, a first TL structure including at least one first test line is formed on a top surface of the interposer 210. Corresponding to operation 304-306, FIGS. 5-8 are side cross-section view of the package 200 at various stages of fabricating the seal member 219 and the first TL structure 240. Referring to FIG. 5, the seal member 219 may be formed by first etching a cavity in the interposer encapsulating layer 216 axially outwards of the interposer substrate 212. A seal member material (e.g., a metal such as copper, gold, silver titanium, and may include the same material used to form the RDLs 214) is deposited in the cavity to form the seal member 219.

A dielectric material is disposed on a top surface 211 of the interposer 210 to form a first TL dielectric first portion 242a of the first TL dielectric layer 242. The dielectric material may include, for example, silicon dioxide, silicon nitride, PI, PBO, BCB, any other suitable dielectric material or combination thereof. The first TL dielectric first portion 242a is patterned to define openings 243 in the first TL dielectric first portion 242a at locations where top RDLs 214 are located at the top surface 211 of the interposer 210. The first TL dielectric first portion 242a may be patterned using photolithography (e.g., a positive and negative photoresist and exposing the photoresist to UV light through a mask) or using a hard mask, and selectively etching (e.g., using a wet etch process or a plasma etching process such as reactive ion etching (RIE), deep reactive ion etching (DRIE), etc.) the first TL dielectric first portion 242a to form the openings 243 through the first TL dielectric first portion 242a.

Figure 6:
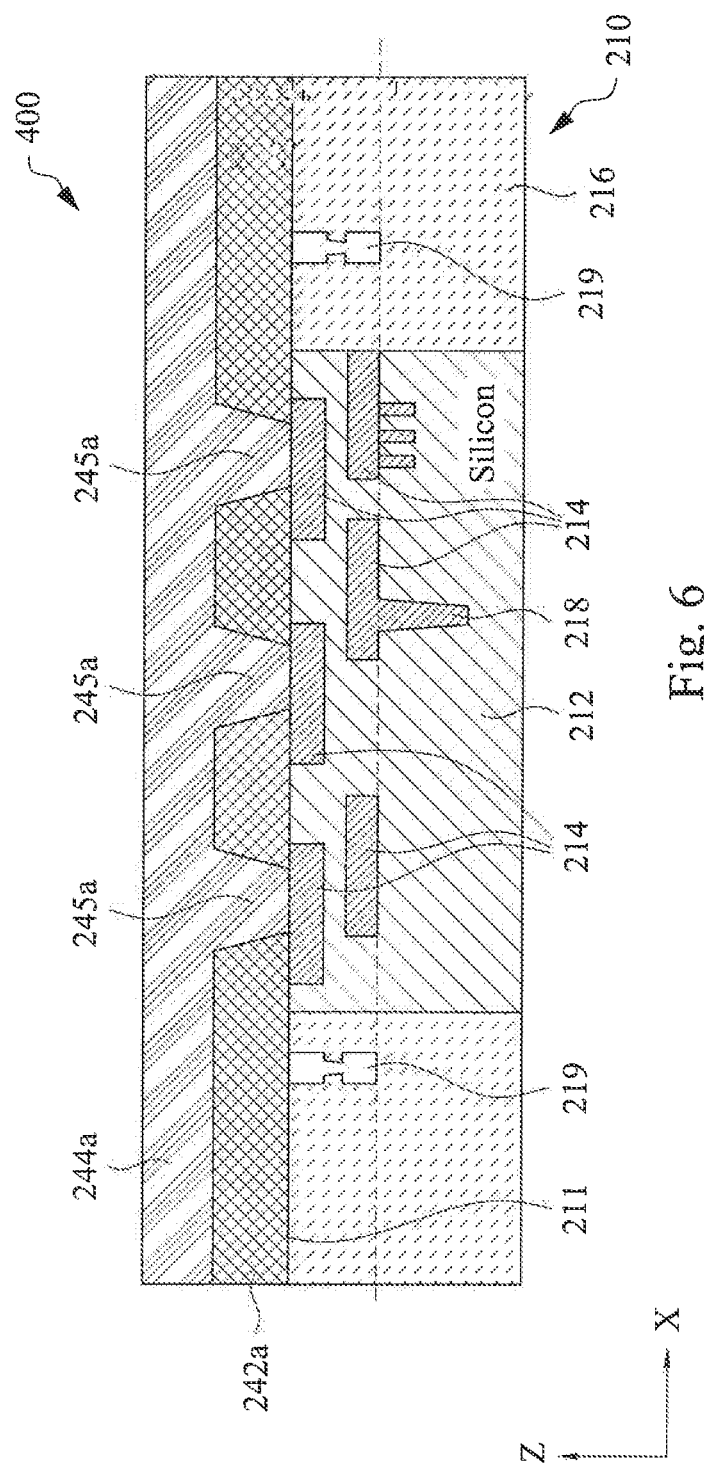
Figure 7:
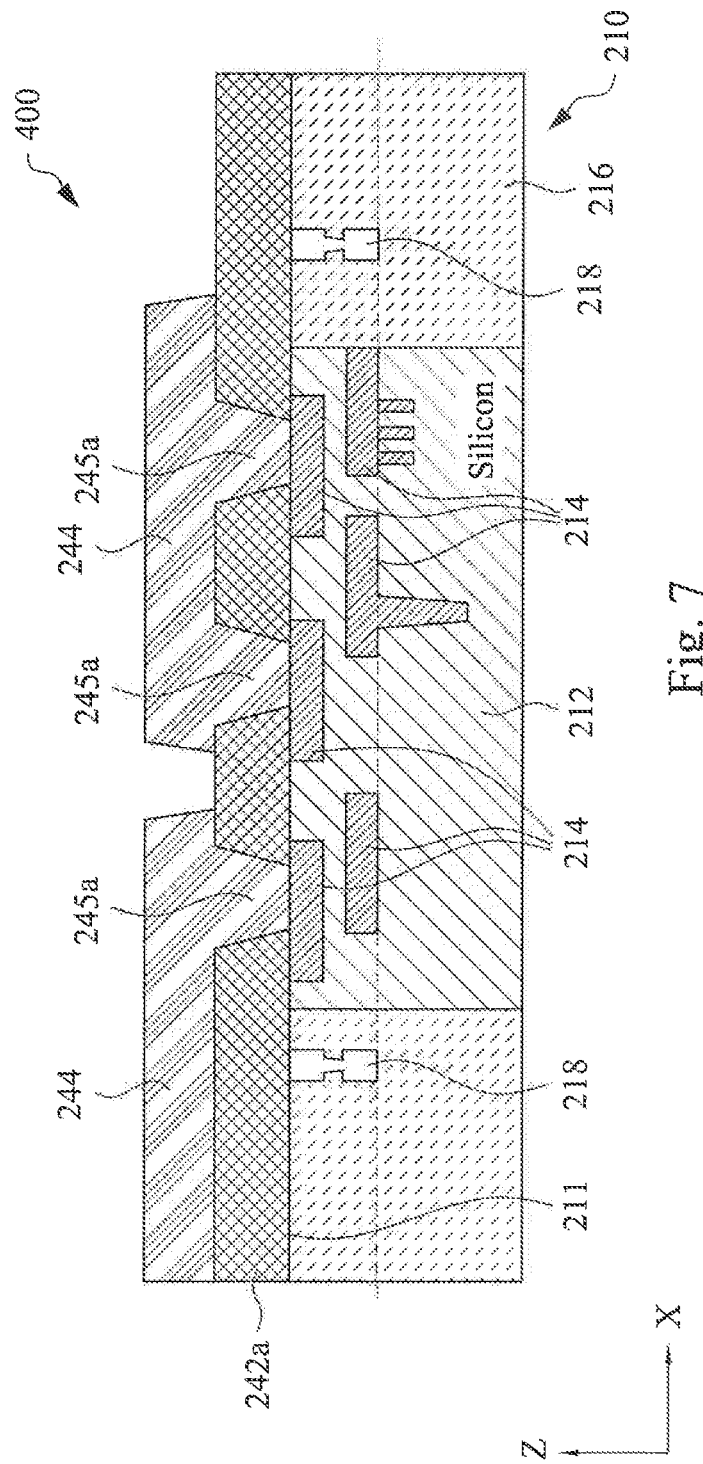

As shown in FIG. 6, a conductive layer 244a is deposited on the first TL dielectric first portion 242a. The conductive layer 244a is also disposed in the openings 243 such that contacting portions 245a of the conductive layer 244a contact corresponding RDLs 214. As shown in FIG. 7, the conductive layer 244a is patterned using photolithography or using a hard mask so as to form at least one first test line 244 on the first TL dielectric first portion 242a.

Figure 8:
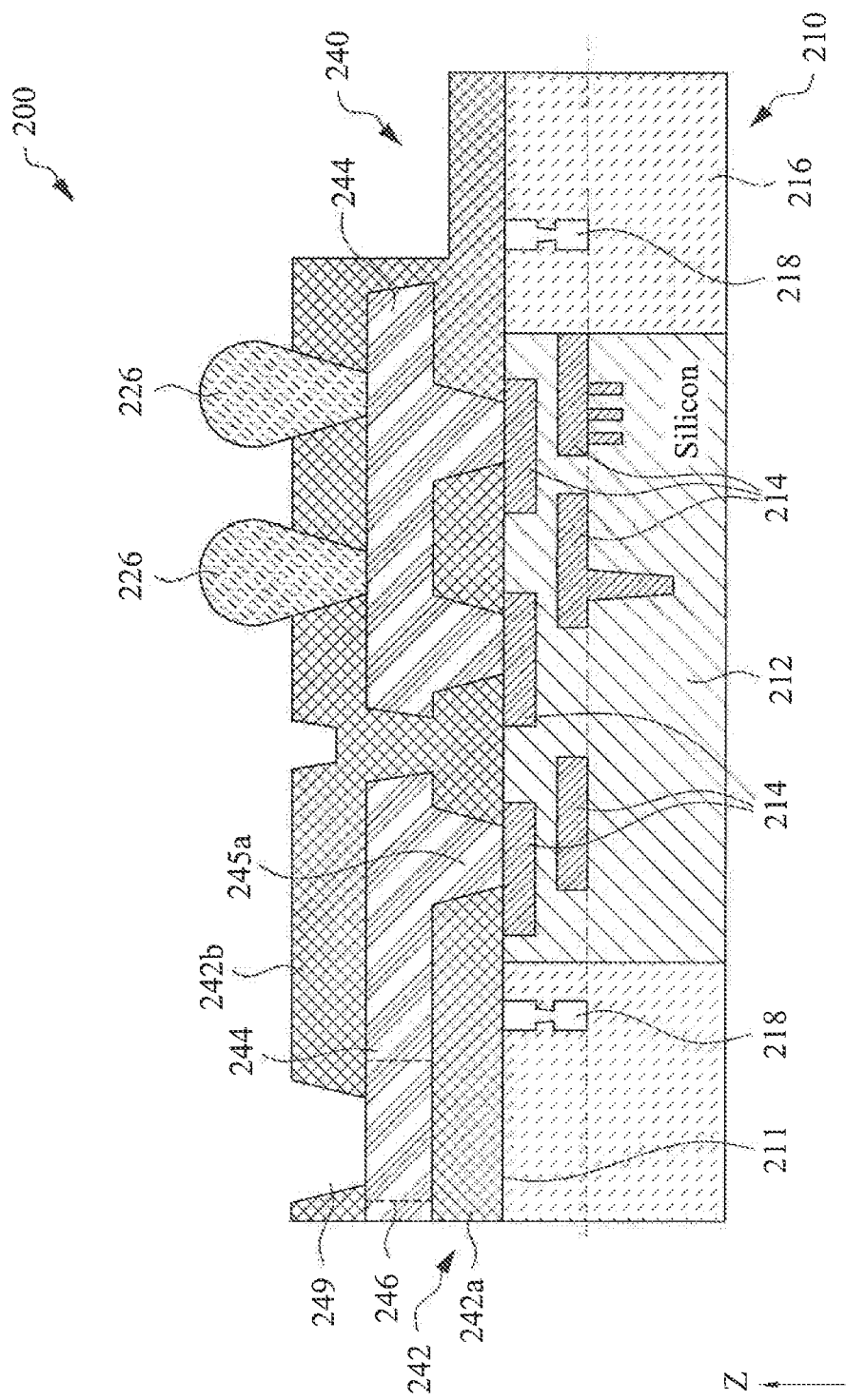

At operation 308, a first test window is formed in the first TL dielectric layer. Corresponding to operation 308, FIG. 8 shows a first test window 249 being formed in the first TL dielectric layer 242. First, the dielectric material is also deposited on the at least one first test line 244 so as to form a first TL dielectric second portion 242b of the first TL dielectric layer 242, such that the first TL dielectric layer 242 with the at least one first test line 244 embedded therewithin is formed. Then, the first test window 249 may be formed by patterning the first TL dielectric second portion 242b using photolithography or a hard mask, and selectively etching the first TL dielectric second portion 242b via a wet etch or a plasma etching process such as RIE, DRIE, etc. The first test window 249 may be formed proximate to an outer axial edge of the at least one first test line 244 where a first test pad 246 is located, such that the first test window 249 is formed around the first test pad 246, thereby exposing a top surface of the first test pad 246 to allow electrical probing.

At operation 310, conductive bumps are disposed on portions of the first test line. For example, as shown in FIG. 8, openings may also be formed in the first TL dielectric second portion 242b at locations where the conductive bumps 226 have to be formed, for example, simultaneously with forming the first test window 249, and the conductive bumps 226 are formed in the openings such that the conductive bumps 226 contact corresponding portions of the at least one first test line 244.

Figure 9:
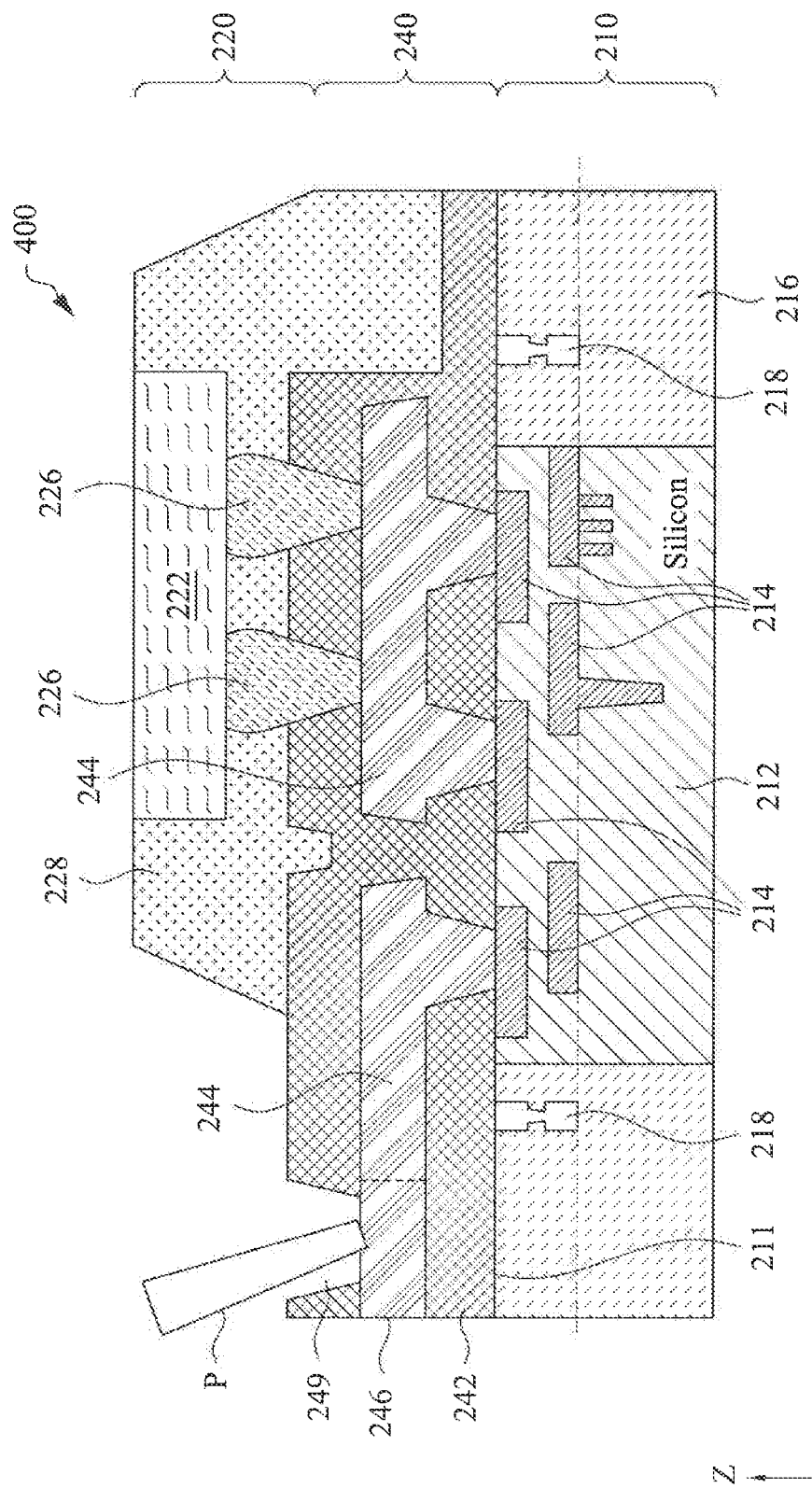

At operation 312, at least one device die is coupled to the conductive bumps 226. At operation 314, the at least one device die is encapsulated in a molding layer. Corresponding to operations 312-314, FIG. 9 is a side cross-section of the completed package 200 after coupling the die device structure 220 to the first TL structure 240. Bonding pads of the device die 222 are bonded to corresponding conductive bumps 226, for example, via soldering, flip chip bonding, reverse solder flow bonding, or any other suitable bonding process. Molding material is then disposed around the device die 222 and also underfills the device die 222 so as to form the molding layer 228. In some embodiments, the method 300 in operation 316 may also include separating a peripheral edge portion of at least the first TL structure 240 (e.g., a portion of the first TL structure 240 and a portion of the interposer 210 located axially outwards of the seal member 219), for example, via wafer dice sawing, or laser cutting so as to separate the portion of the package that includes the first test pad 246 from the package 200. In other embodiments, a dielectric material may be disposed on a top surface of at least the first TL structure 240 that extends beyond the peripheral edge of the die device structure 220 so as to fill the first test window 249 with the dielectric material and thereby, electrically isolate the at least one first test line 224 after testing is complete.

While FIGS. 1A-9 show packages including a first TL structure, in some embodiments, a package may also include a second TL structure coupled to a bottom surface of the interposer opposite the first TL structure. The second TL structure may include at least one second test line electrically coupled to at least one via of the interposer and extending proximate to a peripheral edge of the interposer so as to provide an electrical interface with the at least one via of the interposer.

Figure 10:
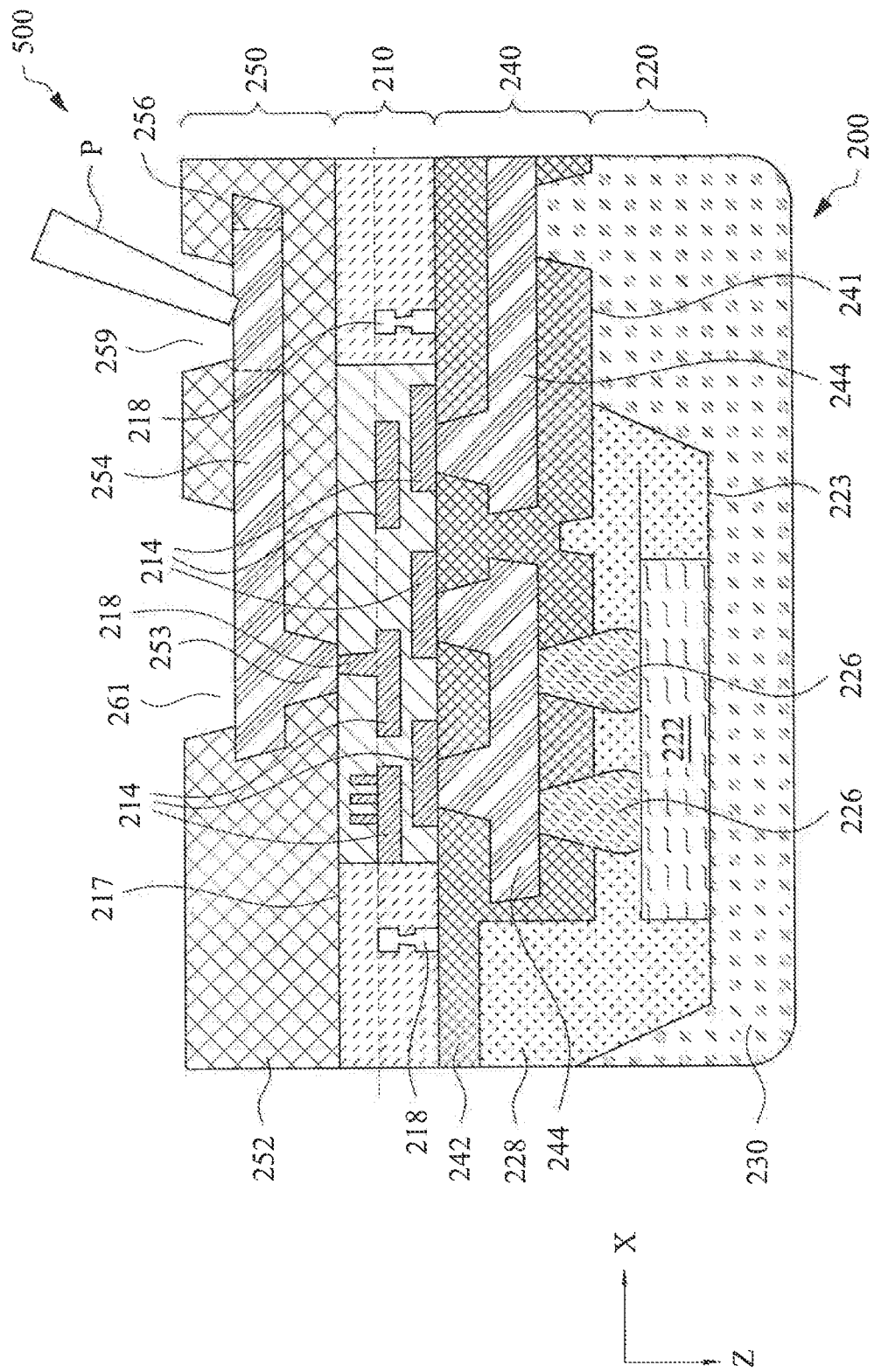
FIG. 10 is a side cross-section view of a package that includes a second TL structure disposed on a bottom surface of an interposer of the package, according to an embodiment.

For example, FIG. 10 is a side cross-section of a package 500 shown in an upside down orientation (i.e., the bottom surface of the package 500 is oriented above a top surface thereof), according to an embodiment. The package 500 includes the package 200 that includes the interposer 210, the die device structure 220, and the first TL structure 240, but additionally includes a second TL structure 250 disposed on a bottom surface 217 of the interposer 210. Moreover, a cap 230 is disposed on a top surface 223 of the die device structure 220 as well as portions of a top surface 241 of the first TL structure 240 that extends beyond a peripheral edge of the die device structure 220. The cap 230 may be formed from a dielectric material, for example, an organic polymer such as PI, PBO, BCB, any other suitable material or a combination thereof. The cap 230 is also disposed in the first test window 249 such so as to electrically isolate the first test lines 244. As such, the cap 230 may be formed after the device die 222, the RDLs 214, and/or other components of the interposer 210 have been tested.

The second TL structure 250 is disposed on and coupled to a bottom surface 217 of the interposer 210 opposite the first TL structure 240. The second TL structure 250 includes a second TL dielectric layer 252 including a dielectric material, for example, silicon dioxide, silicon nitride, PI, PBO, BCB, any other suitable dielectric material, or a combination thereof.

At least one second test line 254 is embedded within the second TL dielectric layer 252. The at least one second test line 254 is formed from a conductive material, for example, gold, platinum, copper, nickel, titanium, chromium, any other suitable conductive material or a combination thereof. A contact portion 253 of the at least one second test line 254 extends through the second TL dielectric layer 252 and contacts the corresponding via 218 of the interposer 210. The at least one second test line 254 extends proximate to a peripheral edge of the interposer 210 so as to provide an electrical interface with the at least one via 218 of the interposer 210. For example, a second test pad 256 may be located at an axial end of the at least one second test line 254. A second test window 259 is defined in the second TL dielectric layer 252 to expose a surface of the second test pad 256. A probe P can then be used to electrically probe and test one or more vias 218 of the interposer 210 before coupling the package 500 to an external substrate. Moreover, coupling windows 261 are also defined in the second TL dielectric layer 252 which serve as electrical coupling locations for electrically coupling the at least one second test line 254 of the second TL structure 250 to the external substrate (e.g., via conductive bumps).

Figure 11:
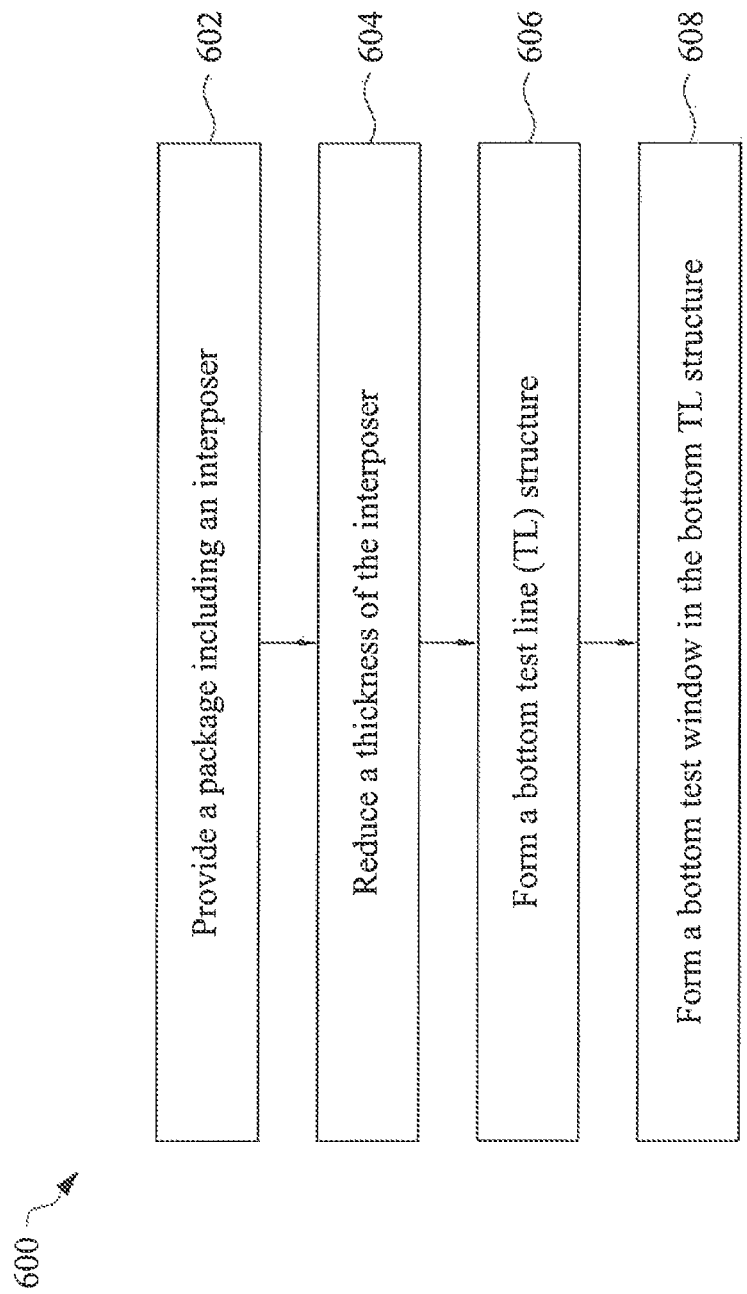
FIG. 11 is a schematic flow chart of a method of forming a package that includes a second TL structure disposed on a bottom surface of an interposer of a package, according to an embodiment.

FIG. 11 is a flow chart of a method 600 for forming a second TL structure, according to an embodiment. The method 600 may be used to form the package 500 or any other package described herein that includes a second TL structure (e.g., the second TL structure 250). For example, at least some of the operations (or steps) of the method 600 may be used to form a semiconductor package (e.g., the package 500), including the second TL structure 250. It should be noted that the method 600 is merely an example, and is not intended to limit the present disclosure. Accordingly, it is understood that additional operations may be provided before, during, and after the method 600 of FIG. 11, and that some other operations may only be described briefly described herein. For example, in some embodiments, the operations of the method 600 may be performed in combination with operations of the method 300 previously described herein. In some embodiments, operations of the method 600 may be associated with side cross-section views of a semiconductor package 500 at various fabrication stages as shown in FIGS. 12, 13, 14, and 15. Although FIGS. 12-15 illustrate the package 500 including the interposer 210, the first TL structure 240, the die device structure 220, and the second TL structure 250, it is understood the package 500 may include a number of other devices such as inductors, fuses, capacitors, coils, etc., which are not shown in FIGS. 12-15, for purposes of clarity of illustration.

Figure 12:
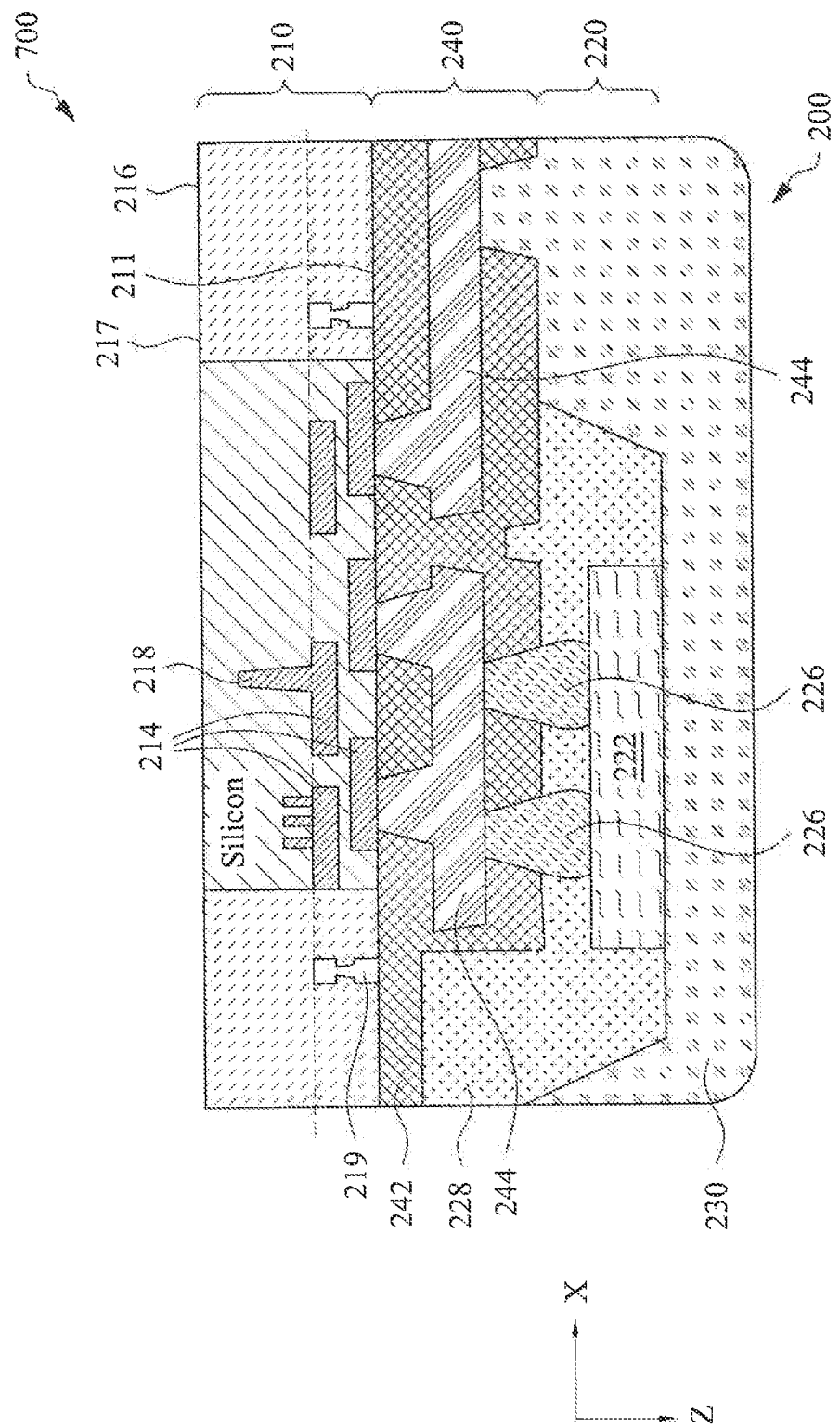
FIGS. 12-15 are side cross-section views of a package formed via the operations of the method of FIG. 11, at various stages of fabrication of the package.

The method 600 includes providing a package including an interposer, at operation 602. Corresponding to operation 602, FIG. 12 is a side cross-section view of a package 500 that includes the package 200. The package 200 includes the interposer 210, the die device structure 220, and the first TL structure 240 interposed therebetween. The package 200 is shown in an upside down orientation, i.e., a bottom surface 217 of the interposer 210 is shown as being above the top surface 211 of the interposer 210.

Figure 13:
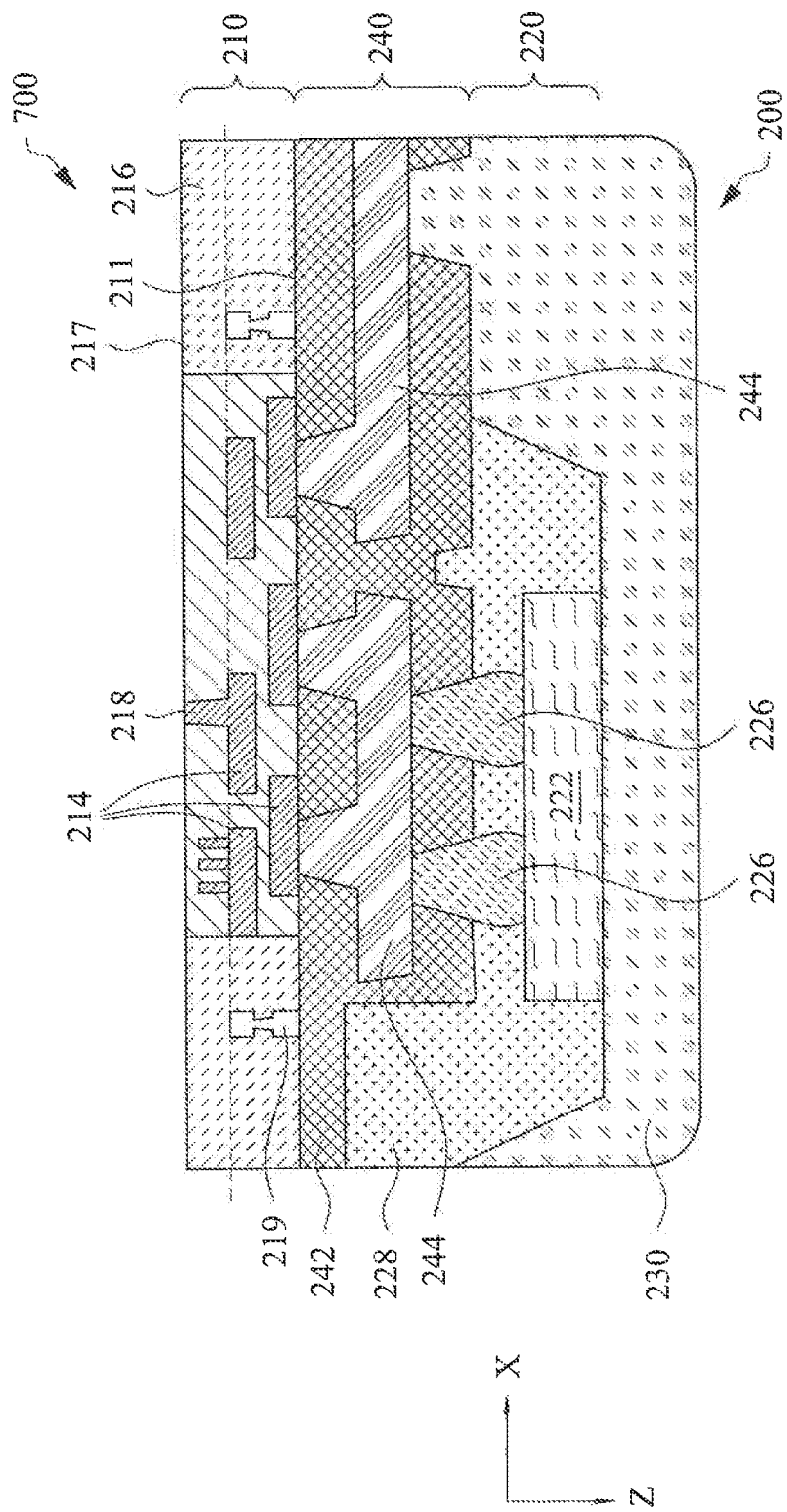

At operation 604, a thickness of the interposer is reduced. Corresponding to operation 604, FIG. 13 is a side cross-section of the package 500 after reducing the thickness of the interposer 210. To reduce the thickness, the bottom surface 217 of the interposer substrate 212 as well as the surrounding encapsulating layer 216 may be subjected to a grinding operation, or a chemical-mechanical polishing (CMP) operation to reduce a thickness of the interposer 210 and expose a bottom surface of the at least one via 218.

Figure 14:
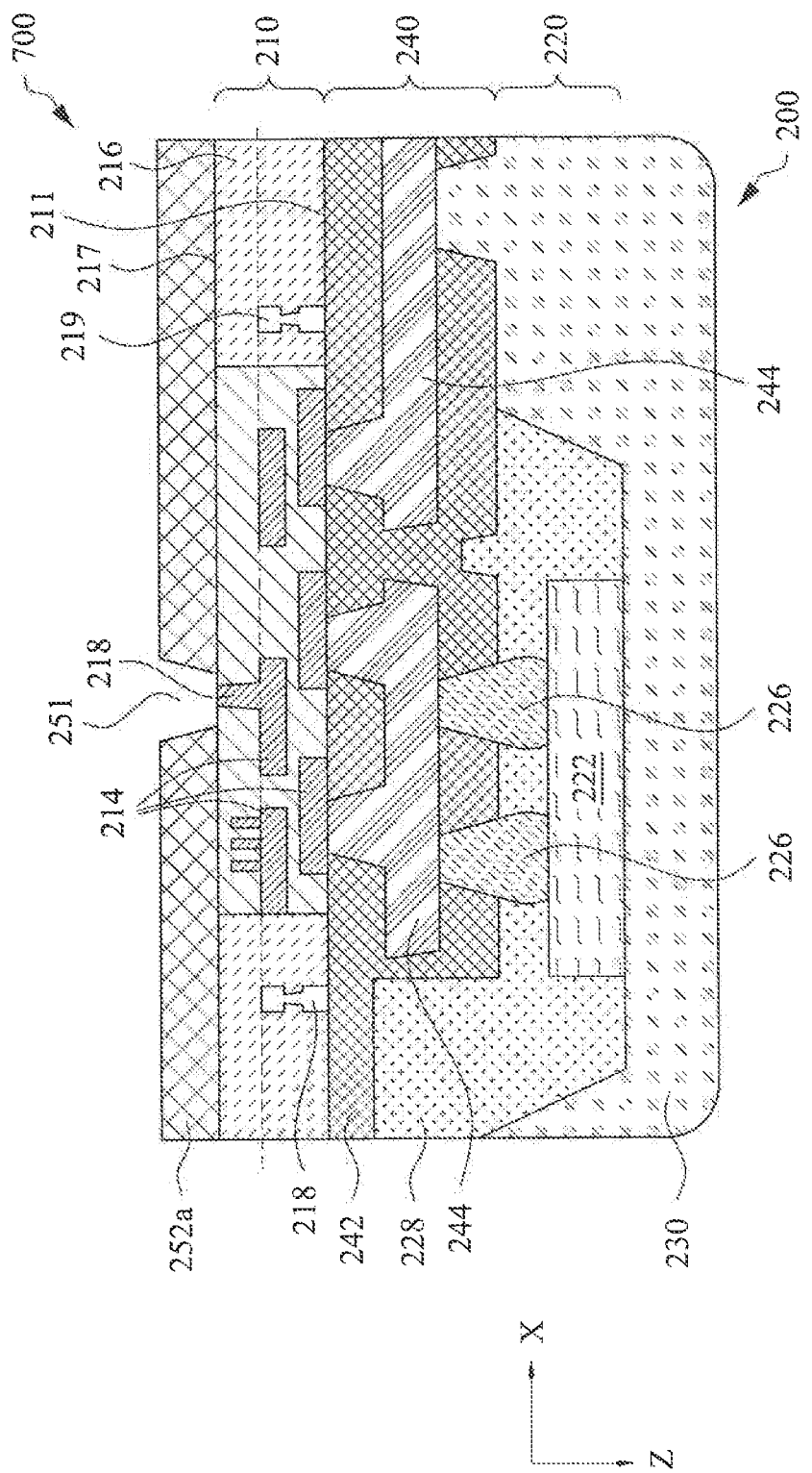
Figure 15:
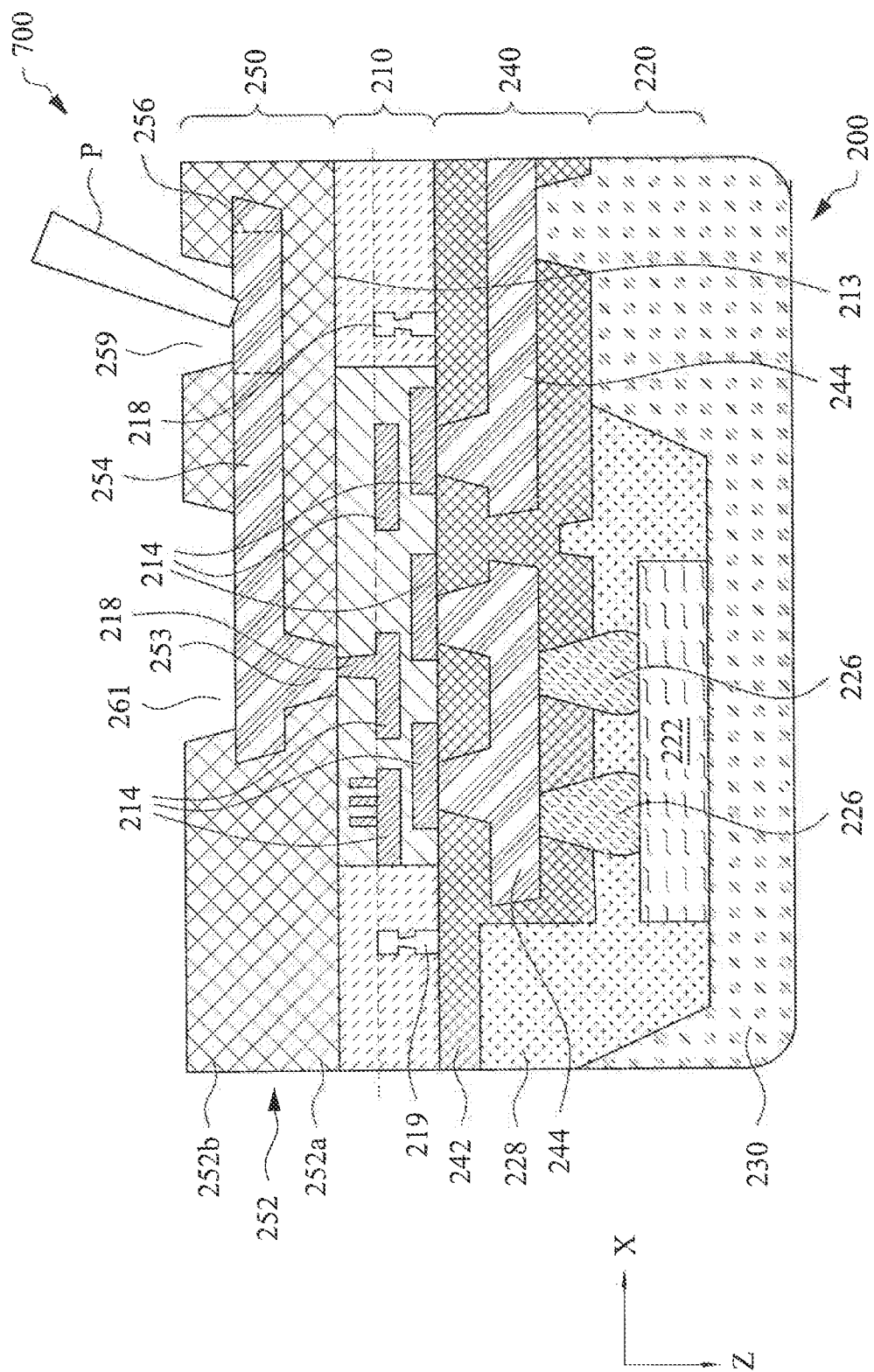

At operation 606, a second TL structure is formed on a bottom surface of the interposer. At operation 608, a second test window is formed in the second TL structure. Corresponding to operations 606-608, FIGS. 14-15 are side cross-sections of the package 500 at various stages of fabrication of the second TL structure 250. As shown in FIG. 14, a dielectric material is deposited on the bottom surface 217 of the interposer 210 to form a second TL dielectric first portion 252a which is disposed on the bottom surface 217 of the interposer 210. One or more openings 251 are formed in the second TL dielectric first portion 252a at locations where the one or more vias 218 are located so as to expose a top surface of the one or more vias 218. The openings 251 may be formed via photolithography or a hard mask, and selectively etching the second TL dielectric first portion 252a using a wet etch or a dry etch (e.g., a plasma etch such as ME, DRIE, etc.).

A conductive layer is disposed on the second TL dielectric first portion 252a and patterned (e.g., via photolithography or using a hard mask followed by dry or wet etching of the conductive layer) to form the at least one second test line 254. A dielectric material is then disposed on top of the at least one second test line 254 as well as the exposed portion of the second TL dielectric first portion 252*a* to form a second TL dielectric second portion 252*b*—the second TL dielectric first and second portions 252*a/b* together forming the second TL dielectric layer 252. In this manner, the at least one second test line 254 is encapsulated within the second TL dielectric layer 252. A second test pad 256 is located at an axial end of the at least one second test line 254.

The second TL dielectric second portion 252*b* is patterned (e.g., via photolithography or using a hard mask followed by dry or wet etching of the second TL dielectric second portion 252*b*) to define a second test window in the second TL dielectric second portion 252*b* so as to expose a surface of the second test pad 256. Thus, a probe P can then be used to test the one or more vias 218 of the interposer 210 via the at least one second test line 254. In some embodiments, coupling windows 261 may also be formed in the second TL dielectric second portion 252*b* so as to allow electrical coupling of the second test line with an external substrate (e.g., via conductive bumps) and thereby, electrically coupling of the one or more vias 218 to the external substrate through the second test lines 254. In some embodiments, once the external substrate is coupled to the package 500, an underfill material is inserted between the external substrate and the second TL structure 250 so as to protect any conductive bumps as well as fill the second test window 259 and electrically isolate the second test pad 256.

In some embodiments, a package comprises an interposer, comprising: an interposer substrate including at least one layer, and a plurality of redistribution lines (RDLs) formed through at least a portion of the interposer substrate. The package also comprises a die device structure comprising at least one device die, and a first test line (TL) structure interposed between the interposer and the die device structure. The first TL structure comprises at least one first test line electrically coupled to the at least one device die and at least a portion of the plurality of RDLs, wherein at least a portion of the at least one first test line extends beyond a peripheral edge of the die device structure to provide an electrical interface with the at least one device die and/or the interposer.

In some embodiments, a package comprises an interposer, comprising: an interposer substrate including at least one layer, and at least one via formed through at least a portion of the interposer substrate. The package also includes a die device structure comprising at least one device die disposed on the interposer, and a second TL structure coupled to interposer opposite the die device structure. The second TL structure comprises at least one second test line electrically coupled to the at least one via and extending proximate to a peripheral edge of the interposer so as to provide an electrical interface with the at least one via of the interposer.

In some embodiments, a method comprises providing an interposer comprising an interposer substrate comprising at least one layer, and a plurality of RDLs formed through at least a portion of the interposer substrate; forming a first test line (TL) structure on the interposer, the first TL structure comprising at least one first test line; disposing conductive bumps on portions of the at least one first test line; and coupling a device die of a die device structure to the conductive bumps. At least a portion of the at least one first test line extends beyond a peripheral edge of the die device structure so as to provide an electrical interface with the at least one device die and/or the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   an interposer, comprising:
     an interposer substrate comprising at least one layer, and
     a plurality of redistribution lines (RDLs) formed through at least a portion of the interposer substrate;
   a die device structure comprising at least one device die; and
   a first test line (TL) structure interposed between the interposer and the die device structure, the first TL structure comprising at least one first test line electrically coupled to the at least one device die through a bump interposed between the at least one first test line and the at least one device die, and electrically coupled to at least a portion of the plurality of RDLs, wherein at least a portion of the at least one first test line extends beyond a peripheral edge of the die device structure to provide an electrical interface with the at least one device die and/or the interposer;
   wherein the first TL structure further comprises a first test pad abutted to an axial end of the at least one first test line, and wherein the first test pad has a first surface and the first test line has a second surface, wherein the first surface and the second surface are laterally aligned with each other, wherein the bump coupling the first test line to the at least one device die is disposed along the second surface, and wherein the first TL structure laterally extends beyond the interposer substrate.

2. The package of claim 1, wherein the first TL structure comprises a first TL dielectric layer at least partially encapsulating the at least one first test line.

3. The package of claim 2, wherein:
   a first test window defined in the first TL dielectric layer so as to expose a surface of the first test pad.

4. The package of claim 1, wherein the interposer substrate further comprises:
   a first portion comprising at least one via, and
   a second portion comprising the plurality of RDLs.

5. The package of claim 4, wherein the interposer further comprises:
   an interposer encapsulating layer encapsulating at least a portion of the interposer substrate; and
   a seal member formed in the interposer encapsulating layer around the second portion of the interposer substrate.

6. The package of claim 4, wherein the package further comprises a second TL structure coupled to the interposer opposite the first TL structure, the second TL structure comprising at least one second test line electrically coupled to the at least one via and extending proximate to a peripheral edge of the interposer so as to provide another electrical interface with the at least one via of the interposer.

7. The package of claim 6, wherein the second TL structure comprises:
- a second test pad located at an axial end of the at least one second test line, and
- a second test window defined in a second TL dielectric layer so as to expose a surface of the second test pad.

8. The package of claim 1, wherein the die device structure further comprises:
- a molding layer, at least a portion of the at least one device die being encapsulated within the molding layer.

9. A package, comprising:
- an interposer, comprising:
  - an interposer substrate comprising at least one layer, and
  - at least one via formed through at least a portion of the interposer substrate;
- a die device structure including at least one device die disposed on the interposer;
- a first TL structure interposed between the interposer and the die device structure, and comprising at least one first test line electrically coupled to the at least one device die through a bump interposed between the at least one first test line and the at least one device die; and
- a second test line (TL) structure coupled to the interposer opposite the die device structure, the second TL structure comprising at least one second test line electrically coupled to the at least one via and extending proximate to a peripheral edge of the interposer to provide an electrical interface with the at least one via of the interposer;
- wherein the second TL structure further comprises a second test pad abutted to an axial end of the at least one second test line, and wherein the second test pad has a first surface and the second test line has a second surface, wherein the first surface and the second surface are laterally aligned with each other, wherein at least the first TL structure laterally extends beyond the interposer substrate.

10. The package of claim 9, wherein the second TL structure comprises:
- a second test window defined in a second TL dielectric layer so as to expose a surface of the second test pad.

11. The package of claim 9, wherein the interposer substrate further comprises:
- a first portion comprising at least one via; and
- a second portion comprising a plurality of redistribution lines (RDLs).

12. The package of claim 11, wherein the at least one first test line is electrically coupled to at least a portion of the plurality of RDLs, at least a portion of the at least one first test line extending beyond a peripheral edge of the die device structure so as to provide an electrical interface with the at least one device die and/or the interposer.

13. The package of claim 12, wherein the first TL structure comprises a first TL dielectric layer at least partially encapsulating the at least one first test line.

14. The package of claim 13, wherein:
- a first test window is defined in the first TL dielectric layer so as to expose a surface of the first test pad.

15. The package of claim 11, wherein the interposer further comprises:
- an interposer encapsulating layer encapsulating at least a portion of the interposer substrate; and
- a seal member formed in the interposer encapsulating layer around the second portion of the interposer substrate.

16. The package of claim 9, wherein the die device structure further comprises:
- a molding layer, the at least one device die being encapsulated within the molding layer.

17. A package, comprising:
- an interposer comprising a plurality of redistribution lines (RDLs) formed over an interposer substrate;
- a die device structure comprising a first device die; and
- a test line (TL) structure interposed between the interposer and the die device structure, the TL structure comprising a first test line electrically coupled to the first device die through a first bump interposed between the first test line and the first device die, and electrically coupled to a portion of the plurality of RDLs, wherein a portion of the first test line extends beyond a peripheral edge of the die device structure;
- wherein the first TL structure further comprises a first test pad abutted to an axial end of the at least one first test line, wherein the first test pad has a first surface and the first test line has a second surface, wherein the first surface and the second surface are laterally aligned with each other, wherein the first bump coupling the first test line to the first device die is disposed along the second surface, and wherein the first TL structure laterally extends beyond the interposer substrate.

18. The package of claim 17, wherein the die device structure further comprises a second device die.

19. The package of claim 18, wherein the TL structure further comprises a second test line electrically coupled to the second device die through a second bump interposed between the second test line and the second device die.

20. The package of claim 17, wherein a first test window is defined in a first TL dielectric layer so as to expose a surface of the first test pad.

* * * * *